(12) United States Patent
Frisch et al.

(10) Patent No.: US 11,194,059 B2
(45) Date of Patent: Dec. 7, 2021

(54) METHODS OF FABRICATING VACUUM HOUSINGS WITH HERMETIC SOLDER SEALS USING CAPILLARY SOLDER WICKS

(71) Applicant: The University of Chicago, Chicago, IL (US)

(72) Inventors: Henry J. Frisch, Chicago, IL (US); Evan Angelico, San Marcos, CA (US); Andrey Elagin, Bolingbrook, IL (US); Eric Spieglan, Lisle, IL (US)

(73) Assignee: The University of Chicago, Chicago, IL (US)

( * ) Notice: Subject to any disclaimer, the term of this patent is extended or adjusted under 35 U.S.C. 154(b) by 112 days.

(21) Appl. No.: 16/842,261

(22) Filed: Apr. 7, 2020

(65) Prior Publication Data
US 2020/0326433 A1    Oct. 15, 2020

Related U.S. Application Data

(60) Provisional application No. 62/831,474, filed on Apr. 9, 2019.

(51) Int. Cl.
| | |
|---|---|
| *H05K 5/06* | (2006.01) |
| *G01T 1/17* | (2006.01) |
| *H01L 31/0203* | (2014.01) |
| *H05K 5/02* | (2006.01) |
| *H05K 5/03* | (2006.01) |

(52) U.S. Cl.
CPC ............ *G01T 1/17* (2013.01); *H01L 31/0203* (2013.01); *H05K 5/0247* (2013.01); *H05K 5/03* (2013.01); *H05K 5/062* (2013.01); *H05K 5/063* (2013.01); *H05K 5/069* (2013.01)

(58) Field of Classification Search
CPC .............................. H05K 5/062; H05K 5/063
See application file for complete search history.

(56) References Cited

U.S. PATENT DOCUMENTS

| | | | | |
|---|---|---|---|---|
| 4,335,273 | A | * | 6/1982 | Levin ...................... F16J 15/02 277/641 |
| 4,350,744 | A | | 9/1982 | Snitzer et al. |
| 5,199,239 | A | * | 4/1993 | Younger ............. B29C 66/1142 174/481 |
| 6,661,668 | B2 | * | 12/2003 | Weiblen ................. H05K 5/063 361/730 |
| 8,431,819 | B2 | * | 4/2013 | Pitkonen ................. H04M 1/18 174/50 |
| 9,004,303 | B2 | * | 4/2015 | Schwarz ................ H02K 5/136 220/4.02 |

(Continued)

OTHER PUBLICATIONS

B.W. Adams et al., A Brief Technical History of the Large-Area Picosecond Photodetector (LAPPD) Collaboration, pp. 1-45. arXiv:1603.01843v1 [physics.ins-det] Mar. 6, 2016.

*Primary Examiner* — Hung V Ngo
(74) *Attorney, Agent, or Firm* — Bell & Manning, LLC

(57) ABSTRACT

Hermetically sealed electronic devices and methods for fabricating the hermetically sealed electronic devices are provided. The devices include a solder sealed vacuum housing. The solder seal is formed using a solder wick having an external solder reservoir. When the reservoir is filled with molten solder, the solder is drawn via capillary action into a precisely defined narrow gap between two components of the housing where it forms an airtight and vacuum-tight seal.

20 Claims, 8 Drawing Sheets

(56) References Cited

U.S. PATENT DOCUMENTS

| | | | |
|---|---|---|---|
| 9,432,491 B2* | 8/2016 | Ogatsu | H04B 1/3888 |
| 9,723,740 B2* | 8/2017 | Yang | B60R 16/0239 |
| 2003/0104651 A1 | 6/2003 | Kim et al. | |
| 2008/0278045 A1* | 11/2008 | Fan | H05K 5/063 |
| | | | 312/223.6 |
| 2010/0144194 A1* | 6/2010 | Umei | H05K 5/063 |
| | | | 439/521 |
| 2012/0058314 A1* | 3/2012 | Mikami | H05K 5/063 |
| | | | 428/195.1 |
| 2012/0227493 A1 | 9/2012 | Vandebeuque | |
| 2015/0173226 A1* | 6/2015 | Murakami | H05K 5/063 |
| | | | 428/192 |
| 2016/0116605 A1 | 4/2016 | Frisch et al. | |
| 2017/0278687 A1 | 9/2017 | Frisch et al. | |

\* cited by examiner

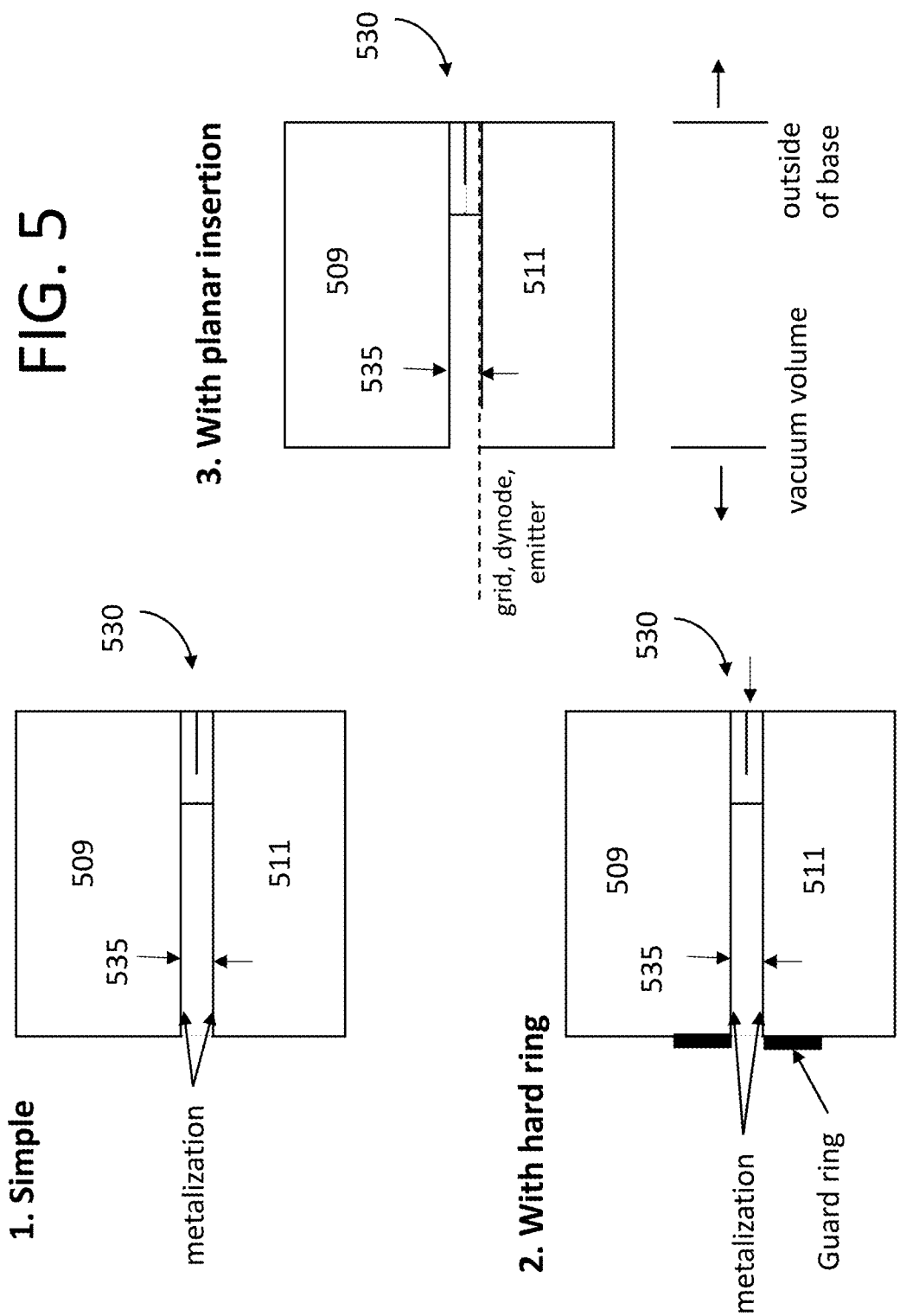

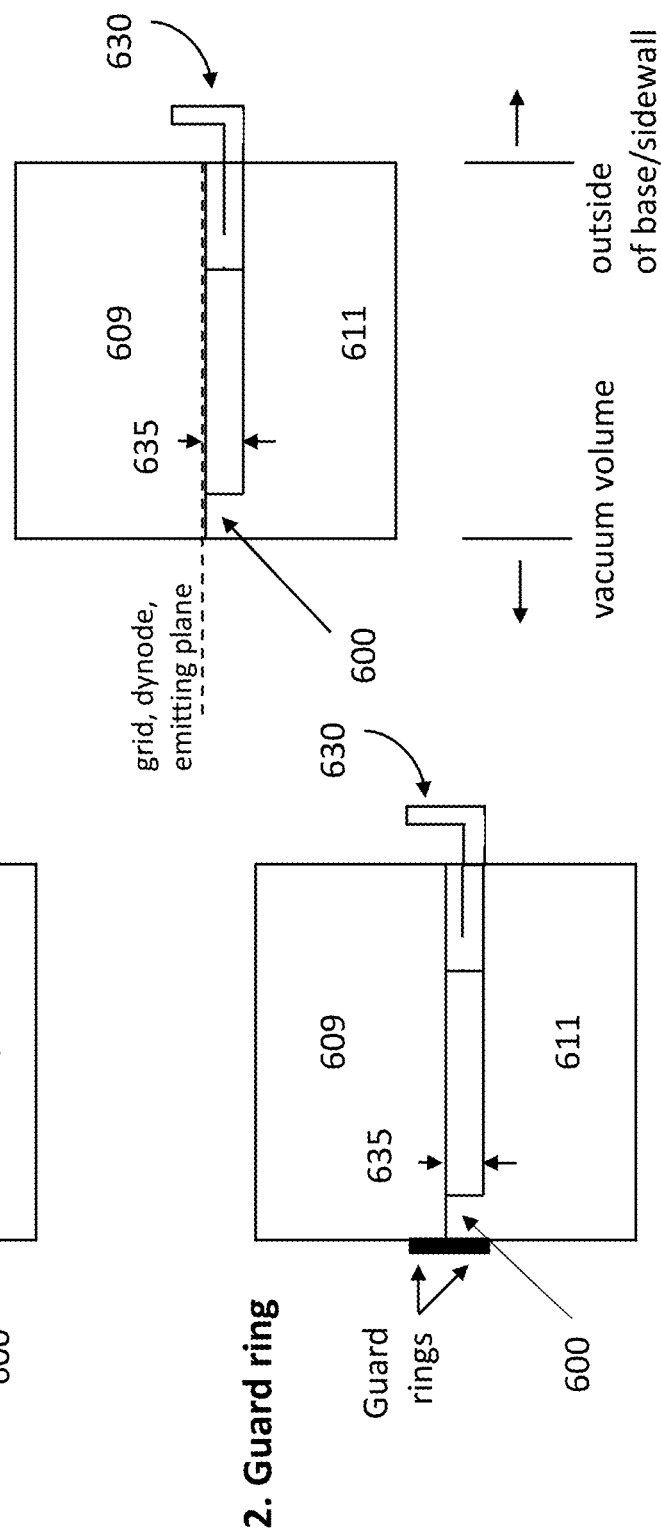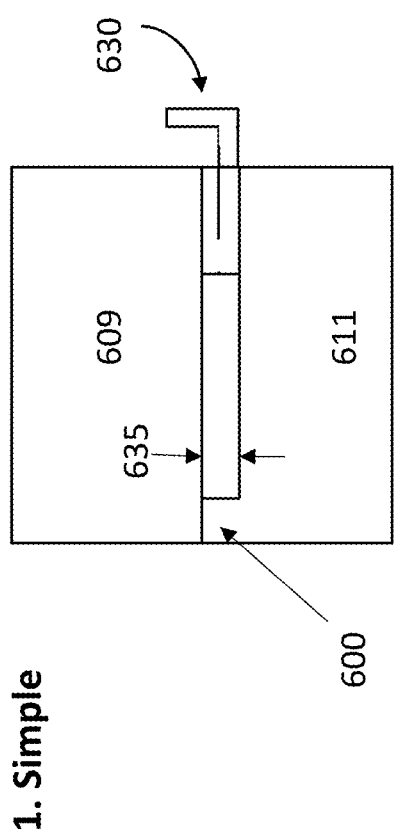

METHODS OF FABRICATING VACUUM HOUSINGS WITH HERMETIC SOLDER SEALS USING CAPILLARY SOLDER WICKS

CROSS-REFERENCE TO RELATED APPLICATIONS

The present application claims priority to U.S. provisional patent application No. 62/831,474 that was filed Apr. 9, 2019, the entire contents of which are incorporated herein by reference.

REFERENCE TO GOVERNMENT RIGHTS

This invention was made with government support under grant numbers DE-SC0011262 and DE-SC0015267 awarded by the Department of Energy and grant number PHY1066014 awarded by the National Science Foundation. The government has certain rights in the invention.

BACKGROUND

Large-area photon detectors have applications in medical imaging, reactor monitoring and nuclear non-proliferation, and in scientific applications in space science, particle physics, nuclear physics, astronomy, and the biological sciences.

Among the many different kinds of large-area photon detectors, vacuum-based multichannel plate-photomultiplier tube detectors (MCP-PMTs) are unique in having the capability of ten-micron pixel sizes or smaller, psec-level ($10^{-12}$ s) time-resolution, high gain, and low noise. Recent developments in this technology have made possible the coverage of large areas by advances in capillary substrate manufacture, resistive and emissive coatings, and psec-resolution low-power electronics systems.

The dominant barrier to adoption of the MCP-PMT technology is the lack of an efficient high-yield production process with low cost per unit area. For wide-spread adoption of the technology, efficient high-yield high-throughput assembly methods are needed. In particular, the hermetic solder seals used to seal vacuum housings for MCP-PMTs and other vacuum detectors have proved difficult to scale up to large-area.

The prevalent commercial process, called 'vacuum-transfer', of assembling flat panel photodetectors involves synthesizing a photocathode on an entrance window inside a large vacuum vessel and then transferring the window in vacuum by manipulators to meet a tube base.

SUMMARY

Hermetically sealed electronic devices and methods for fabricating the hermetically sealed electronic devices are provided.

One embodiment of a hermetically sealed electronic device includes: an electronic device hermetically sealed within a volume of a vacuum housing. The vacuum housing includes a cover having an external surface and a vacuum surface; a base having an external surface and a vacuum surface; a sidewall that separates the cover from the base, the sidewall having a vacuum surface and an external surface and comprising one or more sidewall segments, wherein the vacuum surfaces of the cover, the base, and the sidewall enclose the vacuum volume; at least one spacer, the at least one spacer defining a gap between a first housing component and a second housing component, the first and second housing components comprising: the sidewall and the cover; the sidewall and the base; or two sidewall segments; a hermetic solder seal formed in the gap, wherein the hermetic solder seal joins a sealing surface of the first housing component to a sealing surface of the second housing component; and a solder wick extending from the external surface of the sidewall at least partially into the gap, the solder wick comprising a reservoir external to the gap, but in capillary communication with the gap. In some embodiments, the solder wick provides an electrical connection between the voltage source and an electrical component of the electronic device.

One embodiment of a method of forming a hermetically sealed electronic device includes the step of: placing an electronic device in an unsealed vacuum housing, the vacuum housing comprising: a cover having an external surface and a vacuum surface; a base having an external surface and a vacuum surface; a sidewall that separates the cover from the base, the sidewall having a vacuum surface and an external surface and comprising one or more sidewall segments, wherein the vacuum surfaces of the cover, the base, and the sidewall enclose the vacuum volume; and at least one spacer, the at least one spacer defining a gap between a first housing component and a second housing component, the first and second housing components comprising: the sidewall and the cover; the sidewall and the base; or two sidewall segments. The method further includes the steps of inserting a solder wick comprising a solder reservoir partially into the gap, such that the solder reservoir is external to the external surface of the sidewall; melting solder in the solder reservoir, wherein the melted solder is drawn into the gap by capillary action and forms a hermetic solder seal between a sealing surface of the first housing component and a sealing surface of the second housing component, thereby sealing the vacuum housing; and evacuating the vacuum volume of the sealed vacuum housing to a pressure below atmospheric pressure.

In the methods, the spacer may be an integral part of the first housing component or the second housing component; the spacer may be an integral part of the solder wick; the solder wick may provide an electrical connection between a voltage source and an electrical component of an electronic device, such as a grid, a mesh, a wire plane, a foil, a dynode, a secondary emitting layer, or two or more thereof; and/or the electronic device may be a radiation detector, and/or the solder wick may provide an electrical connection between the voltage source and the vacuum surface of the cover, the vacuum surface of the base, the vacuum surface of the sidewall, or two or more thereof, and/or the solder wick may be connected to a heat source that is external to the vacuum housing to the solder wick. In some embodiments, the electronic device is an MCP-PMT and the electrical component carries out at least one function selected from: modification of an electric field at a photocathode to change a cathode spectral response, electron emission noise, or response to a magnetic field; modification of an electric field near an anode to change signal timing or spatial distribution of a charge; and modification of an electric field in other internal locations to change noise, breakdown, or another operational characteristic. The electronic device may be an MCP-PMT and the electrical component may as a gate to limit or suppress response.

BRIEF DESCRIPTION OF THE DRAWINGS

Illustrative embodiments of the invention will hereafter be described with reference to the accompanying drawings, wherein like numerals denote like elements.

FIG. 5 shows three configurations of a vacuum housing that includes an integrated solder wick at the external edge of a joint between two segments of a sidewall or a joint between the sidewall and the cover. In addition to providing the capillary path for the molten solder, the solder wick acts as the spacer to set the thickness of the seal. First configuration: metallization on the upper and lower sidewall segment surfaces; Second configuration: metallization on the upper and lower sidewall segment surfaces and guard rings on the vacuum surfaces of the sidewall segments; Third configuration: either the first or second configuration with a planar connector extending into or across the vacuum volume. Possible planar connectors include, but are not restricted to, a grid, a mesh, a wire plane, a foil, a dynode structure, or other secondary emitters.

FIG. 6 shows three configurations of a vacuum housing that includes a spacer formed on the inner edge of a sidewall segment and a solder wick at the external edge of a joint between two sidewall segments. The spacer may be integrated into one layer or may be a discrete component, and may act as a solder wick. The three panels show: 1) metallization on the upper and lower surfaces of the sidewall segments; 2) metallization on the upper and lower surfaces and guard rings on the vacuum surfaces; and 3) either 1) or 2) with a planar connector extending into or across the vacuum volume. Possible insertions include, but are not restricted to, a grid, a mesh, a wire plane, a foil, a dynode structure, or other secondary emitters.

DETAILED DESCRIPTION

Hermetically sealed electronic devices and methods for fabricating the hermetically sealed electronic devices are provided. The devices include a solder sealed vacuum housing. The solder seal can be formed using a solder wick having an external solder reservoir. When the reservoir is filled with molten solder, the solder is drawn ("wicked") via capillary action into a precisely defined narrow gap between two components of the housing where it forms an airtight and vacuum-tight seal.

Figure 1:
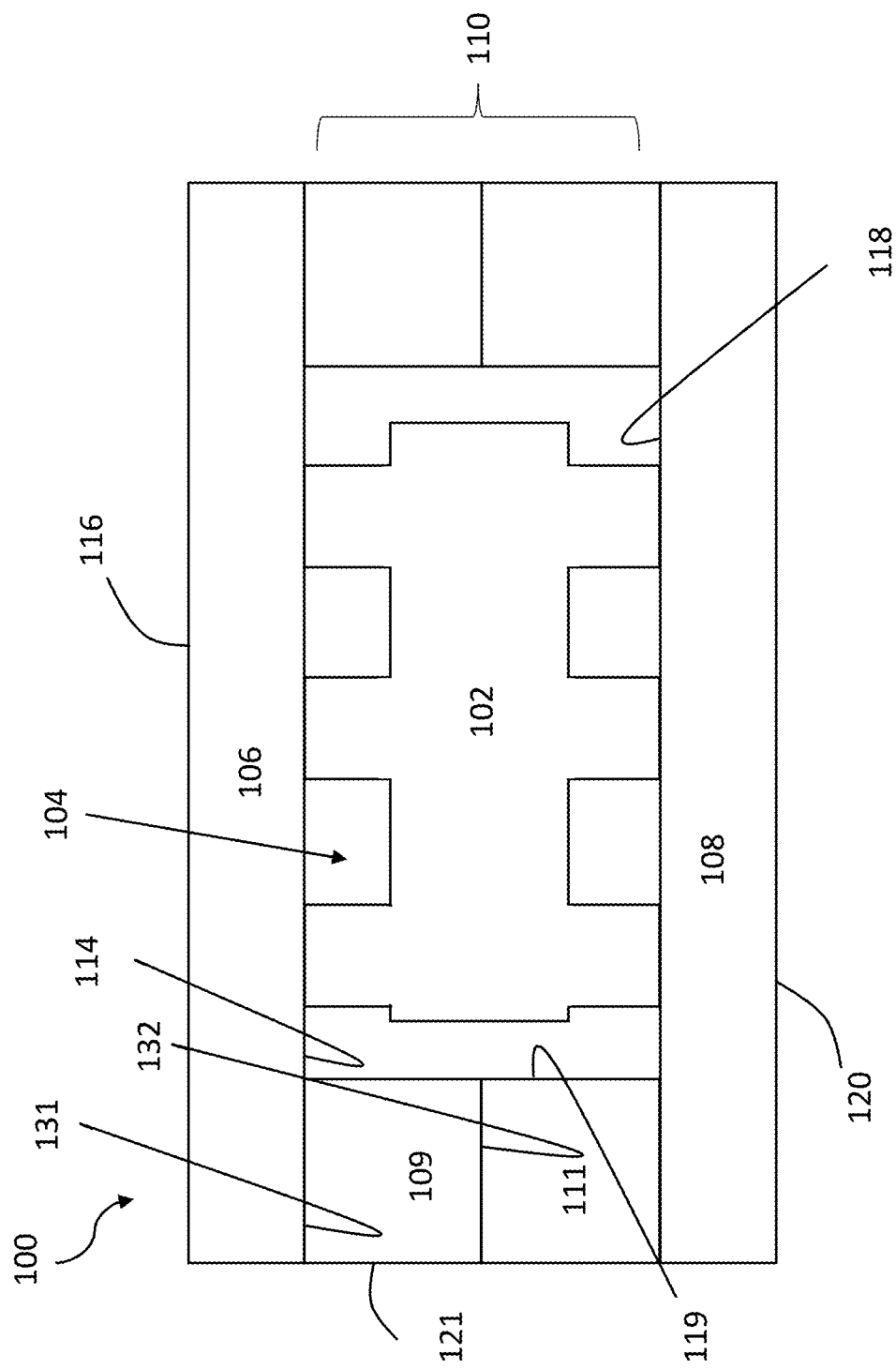
FIG. 1 shows a generic large-area hermetic detector housing (also referred to as a detector package), comprising: a top entrance cover (for example, a window); an integrated base and sidewall assembly; the sidewall; an upper sidewall segment (optional, and may comprise multiple segments); a base sidewall segment (this may be integrated with the housing base); a photocathode layer on the vacuum side of the window (optional); a window-to-sidewall solder seal; a sidewall segment-to-sidewall segment solder seal; and an internal detector system. The housing may have conduits in communication with vacuum pumps and/or the gas sources (not shown).

A cross-sectional view of one embodiment of a sealed electronic device is shown in FIG. 1. The sealed device includes a vacuum housing 100 and an electronic device 102 contained within an internal vacuum volume 104 that is defined by the vacuum housing. Vacuum housing 100 is constructed from multiple components, including a cover 106, a base 108, and a sidewall 110 that connects the cover to the base. As shown in this embodiment, sidewall 110 can be a single unitary wall or can be constructed from two or more adjacent sidewall segments 109, 111. The sidewall completes the vacuum volume by enclosing it on all sides between the cover and the base. For example, in a rectangular housing, the sidewall will be a rectangular frame and in a circular housing, the sidewall will be a section of a hollow cylinder, but the shape can be general to allow detector housings of custom geometries. Cover 106 includes a vacuum surface 114 and an external surface 116 that generally faces opposite the vacuum surface. As used herein, the term vacuum surface refers to a surface of a component that faces into the vacuum volume and is exposed to the vacuum when the vacuum housing is assembled and sealed, while the term external surface refers to a surface that is external to the vacuum volume. Base 108 and sidewall 110 also include a vacuum surface 118, 119 and an external surface 120, 121. Together, vacuum surfaces 114, 118, and 119 define vacuum volume 104. The locations of a cover-to-sidewall seal is identified as 131, and the location of a sidewall segment-to-sidewall segment seal, if present, is identified as 132. The components that make up the vacuum housing should be made from materials that are compatible with vacuum conditions, including high vacuum conditions (e.g., pressures less than $10^{-3}$ Torr) or ultrahigh vacuum (UHV) conditions (e.g., pressures less than $10^{-8}$ Torr). Suitable materials include metals such as stainless steel, glass, and ceramics.

In the vacuum housing embodiment shown in FIG. 1, the sidewall and the base are discrete components adjacent at an interface. However, as illustrated in the alternative embodiment shown in FIG. 2, a base 208 and sidewall 210 can also be formed as a monolithic structure from a single material without an interface. In this embodiment, cover 206 is provided as a discrete component.

Figure 2:
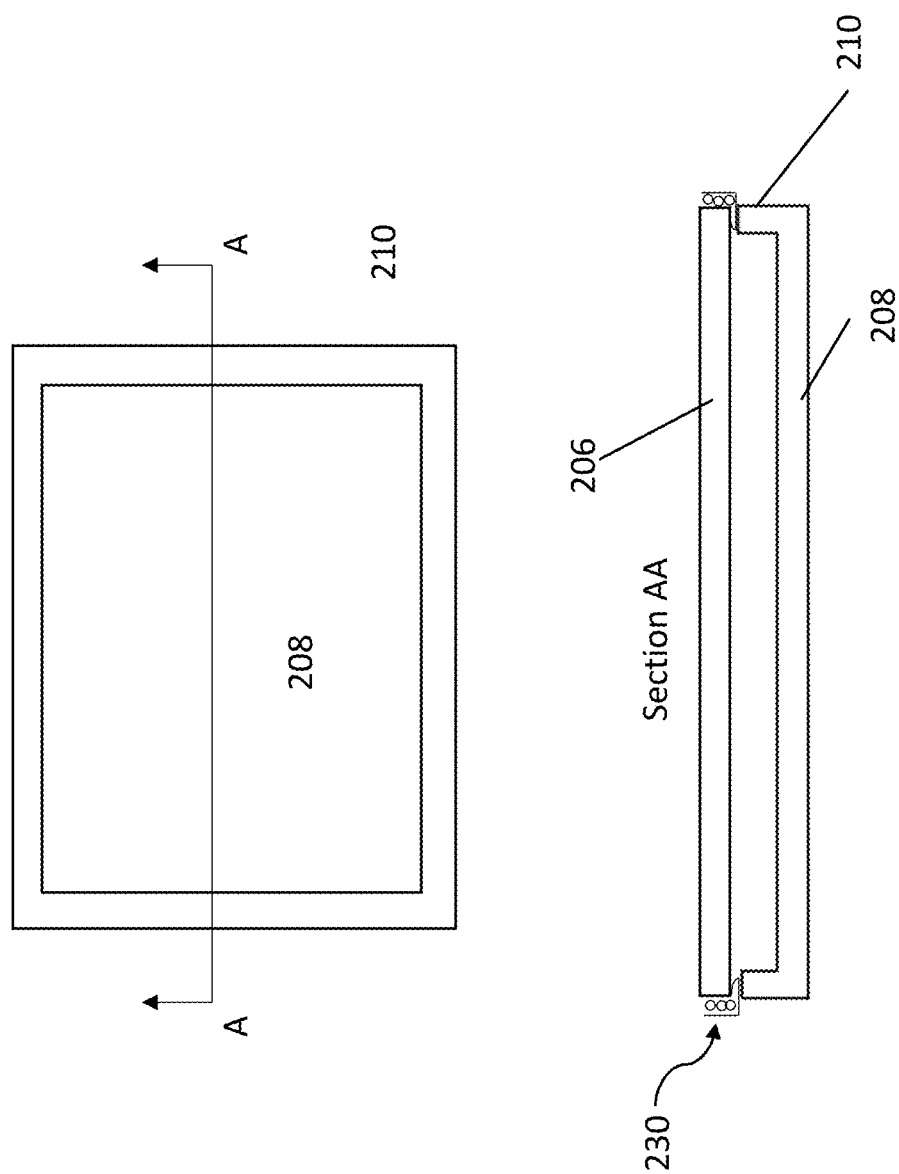
FIG. 2 shows a plan view of a monolithic structure that forms a housing base and a housing sidewall. Section AA shows an elevation view that includes a solder wick in place between a cover and the sidewall of the housing.
Figure 3:
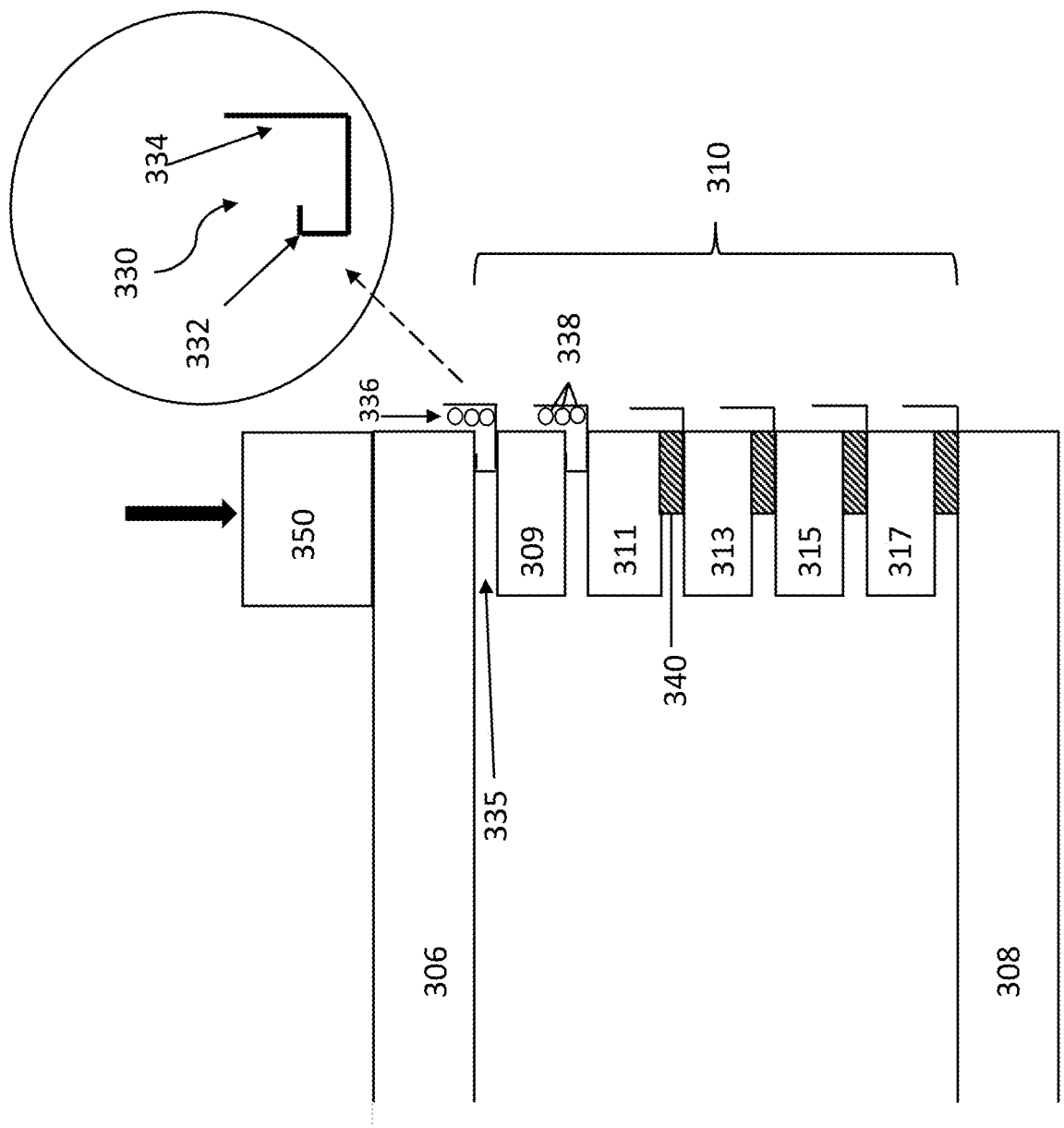
FIG. 3 shows an elevation view of a housing having a sidewall comprising a plurality of stacked sidewall segments, to be sealed between a cover and a base. There are 5 sidewall segments in this example. The housing components are clamped in place before the vacuum volume is evacuated and before the solder is heated and melted so that there is no vertical motion or horizontal motion of the components as the solder melts and wicks into the sealing gap.

In the vacuum housing embodiments shown in FIG. 1 and FIG. 2, the sidewall is composed of two sidewall segments (FIG. 1) or a single wall segment (FIG. 2). However, as illustrated in FIG. 3, the cover 306 and base 308 can be separated by a sidewall having more than two sidewall segments 309, 311, 313, 315, and 317.

The vacuum housings can be used to house a variety of electronic devices, but are particularly well-suited for use with electronic devices, such as photodetectors, that operate under UHV conditions.

Broadly speaking, electromagnetic radiation detectors include detectors that are designed to detect electromagnetic radiation, such as visible radiation, infrared radiation, ultraviolet radiation, X-rays, gamma rays, and combinations thereof. In addition, for the purposes of this disclosure, electromagnetic radiation detectors further include detectors in which detection depends on the electromagnetic interaction of a charged or neutral particle traversing an entrance window, i.e., through either real or virtual photons interacting with the detector housing and generating a signal. Examples of these types of detectors, which are also referred to herein as photodetectors, include neutron detectors for use in national security and calorimeters in high energy physics and nuclear physics.

Photodetectors are constructed on many different principles, with the major categories being detectors based on vacuum tubes, such as photomultipliers (PMT), and solid-state devices. The methods and housings described herein can be used with both categories, but are particularly well-suited for the fabrication of large-area vacuum photodetectors, including, but not limited to, those with micro-channel plate (MCP) amplification stages (MCP-PMT). Detailed descriptions of the parts and operation of MCP-PMT detectors can be found in U.S. Pat. Nos. 6,231,285; 8,604,440; and 9,911,584, the entire disclosures of which are incorporated herein for the purpose of describing the photodetector components and the operation of the photodetectors. The fabrication methods described herein can provide high volume and rapid-turnaround that can be used for batch production of MCP-PMTs, in which the housing is sealed before photocathode production, and a window/photocathode is not manipulated in vacuum but is instead fixed in place before the process begins.

The photodetectors can be used to detect photons from a variety of sources. These include the acceleration of an electric charge that produces electromagnetic radiation, which can be detected as photons. Accelerator beams exploit this phenomenon, called synchrotron emission of photons, at major facilities called light sources. Single particles traversing matter produce light by several mechanisms, including scintillation, Cherenkov radiation, transition radiation, and electromagnetic showers.

One embodiment of a method of forming a sealed housing that includes at least one hermetic solder edge seal is shown in FIG. 3. For simplicity, the electronic device that is disposed within the housing is not depicted in this figure. In the embodiment shown here, six hermetic solder edge seals will be formed. One seal is formed between cover 306 and first sidewall segment 309 (a "cover-sidewall" or "window-sidewall" seal), another seal is formed between base 308 and sidewall segment 317 (a "base-sidewall" seal 320), and four seals are formed between the intervening adjacent sidewall segments ("sidewall-sidewall" seals 324).

For purposes of illustration, the four lower seals in the vacuum housing are shown as formed, while the upper two have not yet been formed. To form the seals, a first portion 332 of a solder wick 330 is inserted between adjacent vacuum housing components (e.g., between cover 306 and sidewall segment 309 or between sidewall segment 309 and sidewall segment 311). A second, external, portion 334 of solder wick 330 extends outwardly from sidewall 310 and defines an external solder reservoir 336, such as a trough. An enlarged view of the solder wick is shown in the inset of FIG. 3. (The same type of solder wick 230 is shown between the cover and the sidewall in FIG. 2.) In the embodiment of the solder wicks shown in FIG. 3, first portion 332 provides a spacer between the adjacent housing components, such that a gap 335 with a predetermined height is defined between those components. (For illustrative purposes, both the size of the gaps and the dimensions of the spacer portion of solder wick 330 are exaggerated in FIG. 3.) Once the solder wicks are in place, a clamp 350 can be used to firmly secure the cover to the base to prevent movement of the components during the sealing process. Solid solder is then placed into solder reservoir 336. The solid solder can be, for example, one or more solder wires 338. The solid solder 338 is then melted to form a molten solder that is drawn into gap 335 by capillary action and solidifies into a solder seal 340. Notably, this process can be carried out in the absence of solder fluxes. In addition, the pre-positioned clamps and spacer ensure that the components remain stationary and precisely located during the sealing process, ensuring a solder seal of reproducible thickness, independent of thermal non-uniformities in solder melting or difficult-to-control motions of the components during sealing.

For a vacuum housing designed to house a photodetector, such as an MCP-PMT, the cover is an entrance window through which photons or photon-generating particles can pass. The window may be transparent to photons in a defined wavelength range or to a high-energy particle which generates photons before or in an amplification stage of the photodetector. The material composition of the window depends on the application, being typically, but not necessarily, glass, fused silica, or other transparent minerals for photons in the optical, UV, or IR, and ceramic or metal for high-energy particles. The window of the MCP-PMT housing may have an air-tolerant photocathode on its vacuum surface, it may have an air-tolerant photocathode precursor that is converted into a photocathode after the housing is sealed, or it may have no photocathode, with the detection of particles being by signals created by electromagnetic interactions (real and virtual photons) in the MCP plates or other structures. The base of an MCP-PMT housing may incorporate on its vacuum surface an anode, the conducting electrode or electrodes that detect pulses of electric charge produced by the detector in response to a photon or photons. Signals may be brought out of the vacuum volume through conductors that penetrate the housing, or by capacitively coupling the internal conducting electrode to user-defined electrodes outside the vacuum volume.

The solder wicks comprise materials that are wettable by the molten solder so as to facilitate the filling of the gap by capillary action. For example, a copper or gold solder wick may be used with indium-based solders and tin-based solders, such as indium, indium alloys (e.g., gold-indium alloys), tin, and tin alloys (e.g., tin-silver and tin-silver-copper alloys). In addition, the sealing surfaces of the components that are being hermetically sealed may be metallized (i.e., coated by a metal layer) that is wettable by the molten solder. The metal layer may include or consist of a metal tie layer, which is a metal that adheres well to both the component surface and the solder. Examples of tie layer metals include, but are not limited to, chrome, titanium, and their alloys. As used herein, the term sealing surface refers to the surface area of a given component that has a footprint corresponding to the solder seal. Thus, the sealing surface of cover 306 in FIG. 3 would be the surface area of the lower surface of cover 306 that is in contact with a solder seal. The sealing surface may be flat or have continuous or occasional structures running parallel to the sidewalls, such as ridges or grooves. Optionally, the solder sealing process may include a vacuum bake at an elevated temperature. In this case, the thickness of the solder seal, the choice of the solder material, and the processing temperature profile may be chosen to minimize stresses caused by any mismatch in the coefficients of thermal expansion (CTE) between the differing materials of the housing components. In addition, a passivation layer can be applied over the tie layer to limit the introduction of oxygen into the seal.

The solder wicks can have a variety of shapes and dimensions. However, if the solder wick also acts as a spacer, as illustrated in FIG. 3, the portion of the solder wick that is inserted between the vacuum housing components should have a thickness corresponding to the desired component spacing. Illustrative spacings include those in the range from 0.0005" to 0.005". However, spacings outside of this range can be used. In addition, the solder wicks should be configured to allow molten solder to flow past the solder wick in the gap in order to form a component-to-component (e.g., window-to-sidewall) seal. This can be accomplished by providing one or more channels between the solder wick and one or both of the components, as illustrated in FIG. 4, which depicts a top view of one embodiment of a solder wick.

Figure 4:
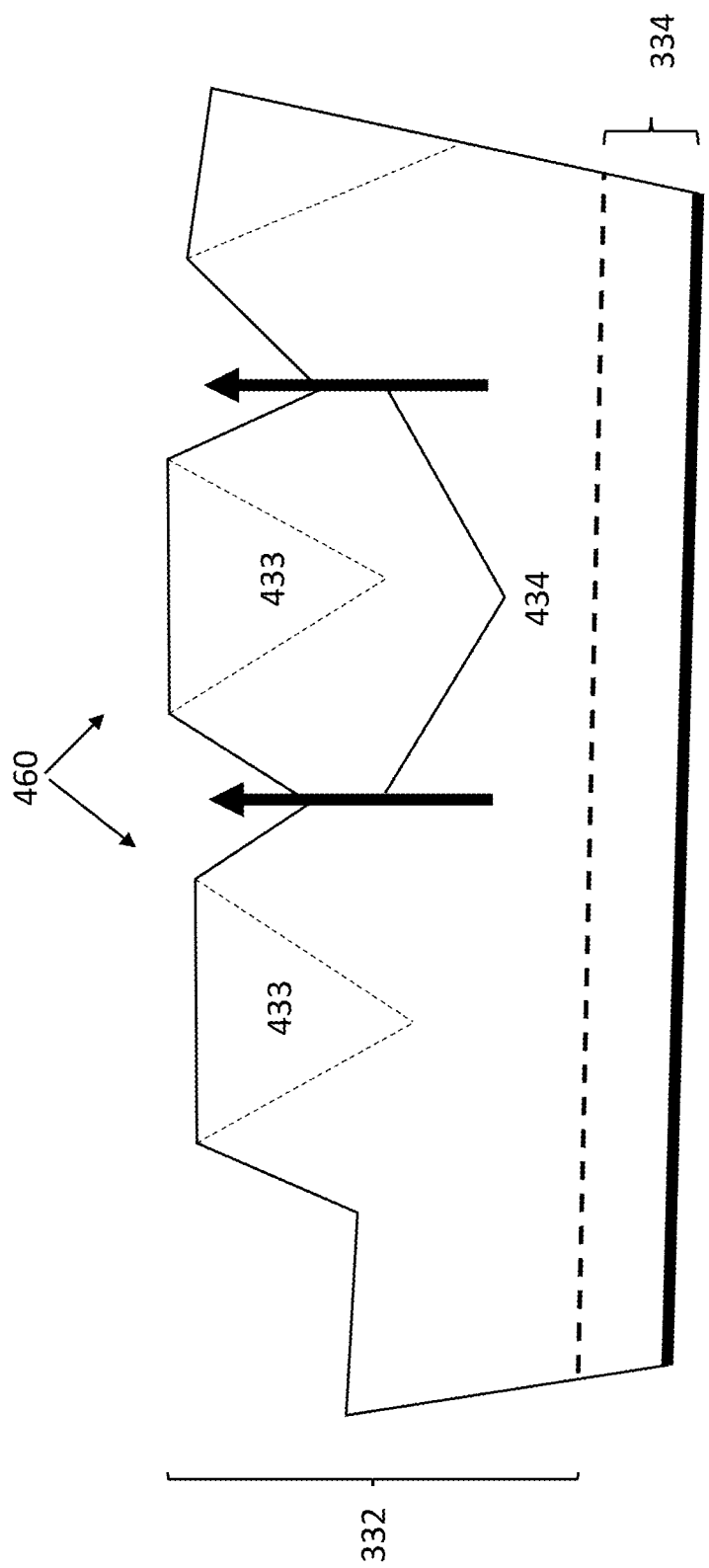
FIG. 4 shows an exemplar solder wick that acts as a spacer. In this example, the wick is made from thin (0.001") copper foil with a dentate pattern on one edge. The teeth are folded over approximately half-way along their length to make a 0.002" spacer that is open to capillary wicking of the molten solder into the gap between the metalized sealing surfaces of the housing components. The solder is shown as a wire in this example, prior to seal formation in the upper two gaps, and as a solidified solder seal in the lower four gaps.

The solder wick of FIG. 4 can be formed from a thin sheet of metal, such as a copper foil. As shown here, a first portion 432 of the solder wick defines a plurality of spaced apart extensions (illustrated here are triangular points or "teeth") 460, the ends 433 of which are folded back upon themselves. Where ends 433 are folded, the thickness of the wick is doubled and this thickness determines the gap spacing. Between folded ends 433, the solder wick is a thinner, single-ply of material and, thus, channels 434 are provided between the teeth to allow molten solder to flow past the wick and further into the gap where it forms a hermetic seal. A second portion 334 of the solder wick extends beyond the external surface of the vacuum housing sidewall when the wick is in place and forms a reservoir for molten solder. The dashed line in the figure indicates the location of the external edge of the sidewall.

In some embodiments of the hermetically sealed vacuum housings, the spacers that form the inter-component gaps are not provided by the solder wick. In these embodiments, the spacers may be discrete elements inserted between the components or may be an integral, monolithic part of one or both of the adjacent components. This is illustrated in FIG. 6, which shows a spacer 600 that is built into the inside edge of a sidewall 609 and defines a gap 635 between sidewall segments 609 and 611. In this embodiment of the housing, the solder wick 630 is inserted into the gap opposite spacer 600.

The solder seals may be formed using a single solder wick between adjacent components or multiple solder wicks between adjacent components. By way of illustration, a single solder wick may extend around the perimeter of the housing between two housing components. Alternatively, two or more solder wicks can be placed spaced-apart around the perimeter of the housing between two housing components. Optionally, once the solder seal is formed, all or part of the external portion of the solder wick can be removed.

In some embodiments of the hermetically sealed electronic devices, the solder wick provides an electrical connection and/or a thermal connection to an electrical component of the electronic device that is housed within the vacuum space. This electrical and/or thermal connection can further form an electrical and/or thermal connection to a device that is external to the vacuum housing, such that the external device and the electrical device housed inside the hermetically sealed vacuum volume are in electrical and/or thermal communication through the solder wick. External devices that can be connected to the solder wick include voltage sources, power sources, and heaters. This is illustrated in panel 3 of FIG. 5 and panel 3 of FIG. 6. As shown in these panels, a planar electrically conductive and/or thermally conductive connector 570, 670 can be inserted between the solder wick and a housing component and extend into the vacuum volume. By way of illustration, for a hermetically sealed MCP-PMT device, the connector may be a grid, mesh, wire plane, foil, dynode, or other secondary emitter. The grid or grids can be used to gate a response; the dynodes can be installed in place of or in addition to microchannel plates in the amplification section of the device. For example, grids can be used for gating the photocathode-MCP gap for suppression of ion feedback, suppression of after-pulsing, and power reduction for limited duty-cycles. Planes of sense wires can provide precise position and time resolution, either independently or in conjunction with the anode. In the case of a sidewall having multiple sidewall segments, the electrical and/or thermal connection at each segment in the sidewall can be used to apply the appropriate voltages to the appropriate layer in the amplification section of the photodetector; for example, in a typical two-plate MCP-PMT the connections would be to each of the photocathodes and the three or four MCP voltages.

The electrical components of the electronic devices may extend into the gap and be soldered in place or held in place in the gap by a clamping force applied to the first and second housing components. In some embodiments, the electrical component extends through the gap and is held in place by an external fixture that is not part of the electronic device.

Similarly, the solder wick can provide an electrical connection and/or a thermal connection to the vacuum surface of the housing within the vacuum space. This electrical and/or thermal connection can further form an electrical and/or thermal connection to a device that is external to the vacuum housing, such that the external device and the vacuum surface in the hermetically sealed vacuum volume are in electrical and/or thermal communication through the solder wick. For example, in the case of a hermetically sealed MCP-PMT detector, equipotential surfaces are typically set on the interior of the sidewall at each segment to prevent charging up of the highly-resistive sidewall surface and to shape the electric field lines adjacent to the edges of the microchannel plates. These equipotential surfaces can be provided by rings that extend around the inner perimeter of the vacuum surface of the sidewall. Thus, in one embodiment of a hermetically sealed MCP-PMT, metallization on the surfaces of the sidewall segments extends from the sealing surfaces of the solder joints to the vacuum surface and then partially up the vacuum surface of one or both of those segments, forming a separate conducting ring around the interior periphery of the vacuum volume on the vacuum surfaces of the sidewall segment. The solder wick then connects to this electrode or electrodes, creating an equipotential at the applied high voltage on which the electric field lines terminate.

A functional layer, such as an electrical grid, mesh, wire plane, foil, dynode structure, or other secondary-emitter, can also be inserted across the vacuum volume of the housing. Because the seal is formed while the housing components are clamped in place and the interior of the housing is accessible during assembly, such layers can be precisely installed before the hermetic solder seals are formed. For example, a very thin grid can be stretched tight over the base and then clamped in place before sealing. The uses of functional layers include, but are not limited to: 1) modification of the electric field at the photocathode to change the cathode spectral response, electron emission noise, and/or response to magnetic field; 2) modification of the electric field near the anode to change signal timing and/or spatial distribution of the charge; 3) modification of the electric field in other internal locations to change noise, breakdown, or other operational characteristics; and 4) to serve as a gate to limit or suppress response during periods for which a reduced photo-response is desired. Planes of sense wires can provide precise position and time resolution, either independently or in conjunction with the anode. Grids can be used for gating the photocathode-MCP gap for suppression of ion feedback, suppression of after-pulsing, and power reduction for limited duty-cycles. The layer may additionally provide a connection to internal components as described above.

EXAMPLE

This example describes the fabrication and characterization of a hermetic solder seal that can be used in the fabrication of large-area photon detectors and other vacuum-based electronic devices.

Figure 7:
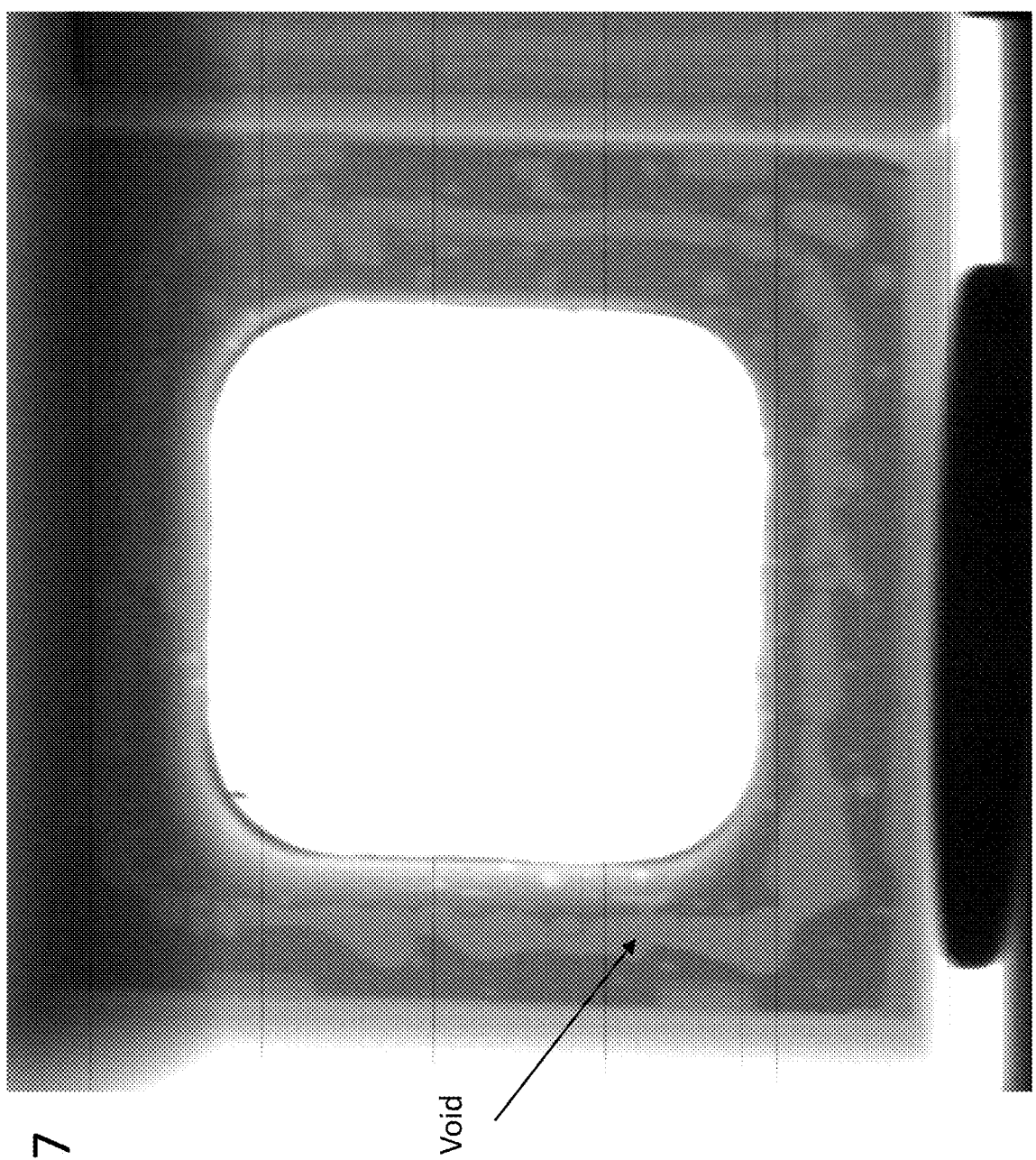
FIG. 7 shows an X-ray image of a sealed 1" test sidewall/window assembly sealed using a conventional method.

A well-known problem in solder seals, and especially in flux-less UHV seals using indium or an indium alloy solder in wire form or in a reservoir in the sealing gap, is the presence of indium oxide in the sealing area. Techniques for removing oxide from this process include acid-etching and/or scraping the solder wire, or, in the case of solder in a reservoir, successive heating and scraping in air. As a comparative example, this method was used to form a solder seal between a glass entrance window and a ceramic base using an acid-etched pure indium solder wire placed between the window and the base. In this process, the unit was assembled, a calibrated pressure was applied to the window, and the assembly heated in vacuum. The window moved downward to compress the molten indium; however, neither the end-point thickness nor the parallelism of the window motion were constrained. FIG. 7 shows an X-ray image of a 1 inch-square sample fabricated by this technique. The lighter color represents a void in the seal where the solder wire was pressed, leaving an oxide layer in the seal. A microscope image of a similar acid-etched pure indium wire showed an oxide on its surface, even after the acid treatment. The solder seals made by placing a solder wire (both In and In—Ag wires were tried) between the components and melting it in place were characterized by voids in all of the samples, with a prevalent pattern being a linear void inside the entire seal area, allowing lateral connection of individual transverse leaks.

Figure 8:
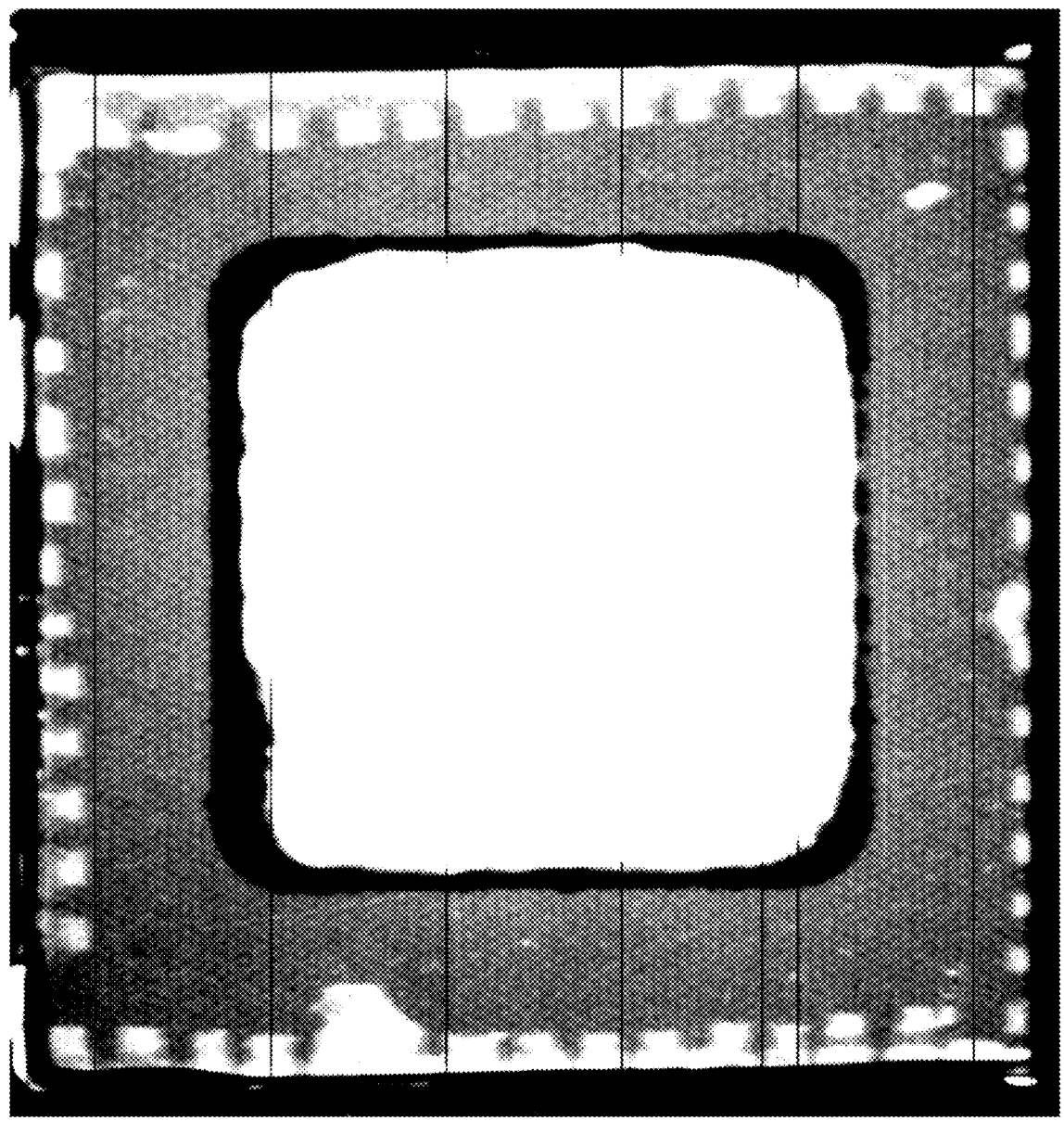
FIG. 8 shows an X-ray image of a sealed 1" test sidewall/window assembly sealed using a method as described herein.

Solder seals between the same window and base were then formed using the solder wick structure shown in FIG. 4 as the spacer, which provided a gap height of 0.002 inches. Acid etched indium solder wire was melted in a reservoir external to the sealing area, and the melted solder was then drawn into the sealing area via capillary action. FIG. 8 shows an X-ray image of the 1 inch-square sample fabricated using the solder wick. No visible voids can be seen in the sealing area.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A hermetically sealed electronic device comprising:
an electronic device hermetically sealed within a volume of a vacuum housing, the vacuum housing comprising:
a cover having an external surface and a vacuum surface;
a base having an external surface and a vacuum surface;
a sidewall that separates the cover from the base, the sidewall having a vacuum surface and an external surface and comprising one or more sidewall segments, wherein the vacuum surfaces of the cover, the base, and the sidewall enclose the vacuum volume;
at least one spacer, the at least one spacer defining a gap between a first housing component and a second housing component, the first and second housing components comprising: the sidewall and the cover; the sidewall and the base; or two sidewall segments;
a hermetic solder seal formed in the gap, wherein the hermetic solder seal joins a sealing surface of the first housing component to a sealing surface of the second housing component; and
a solder wick extending from the external surface of the sidewall at least partially into the gap, the solder wick comprising a reservoir external to the gap, but in capillary communication with the gap.

2. The device of claim 1, wherein the cover is a window comprising a material that is transparent to electromagnetic radiation having wavelengths in at least one of the visible, infrared, and ultraviolet regions of the electromagnetic spectrum.

3. The device of claim 2, wherein the first housing component is the window and the second housing component is the sidewall.

4. The device of claim 1, wherein the sealing surface of the first housing component, the sealing surface of the second housing component, or the sealing surfaces of both the first and the second housing components comprise a metal layer that is wettable by the solder of the solder seal.

5. The device of claim 4, wherein the metal layer comprises a tie metal sublayer adjacent to a passivation metal sublayer.

6. The device of claim 1, wherein the cover, the base, and the sidewall are constructed from ultra-high vacuum compatible materials.

7. The device of claim 6, wherein the ultra-high vacuum compatible materials are metals, glasses, or ceramics.

8. The device of claim 1, wherein the spacer is an integral part of the first housing component or the second housing component.

9. The device of claim 1, wherein the spacer is an integral part of the solder wick.

10. The device of claim 1, further comprising a voltage source that is external to the vacuum housing and in electrical communication with the solder wick.

11. The device of claim 10, wherein the solder wick provides an electrical connection between the voltage source and an electrical component of the electronic device.

12. The device of claim 1, wherein the electronic device is a radiation detector.

13. The device of claim 12, wherein the solder wick provides an electrical connection between the voltage source and an electrical component of the electronic device, and the electrical component comprises an electrical grid, a mesh, a foil, a wire plane, a dynode, and/or a secondary emitting layer.

14. The device of claim 10, wherein the solder wick provides an electrical connection between the voltage source and the vacuum surface of the cover, the vacuum surface of the base, and/or the vacuum surface of the sidewall.

15. The device of claim 1, further comprising a heat source that is external to the vacuum housing and in thermal communication with the solder wick.

16. A method of forming a hermetically sealed electronic device, the method comprising:
 placing an electronic device in an unsealed vacuum housing, the vacuum housing comprising:
  a cover having an external surface and a vacuum surface;
  a base having an external surface and a vacuum surface;
  a sidewall that separates the cover from the base, the sidewall having a vacuum surface and an external surface and comprising one or more sidewall segments, wherein the vacuum surfaces of the cover, the base, and the sidewall enclose the vacuum volume; and
  at least one spacer, the at least one spacer defining a gap between a first housing component and a second housing component, the first and second housing components comprising: the sidewall and the cover; the sidewall and the base; or two sidewall segments;
 inserting a solder wick comprising a solder reservoir partially into the gap, such that the solder reservoir is external to the external surface of the sidewall;
 melting solder in the solder reservoir, wherein the melted solder is drawn into the gap by capillary action and forms a hermetic solder seal between a sealing surface of the first housing component and a sealing surface of the second housing component, thereby sealing the vacuum housing; and
 evacuating the vacuum volume of the sealed vacuum housing to a pressure below atmospheric pressure.

17. The method of claim 16, wherein the cover is a window comprising a material that is transparent to electromagnetic radiation having wavelengths in at least one of the visible, infrared, and ultraviolet regions of the electromagnetic spectrum.

18. The method of claim 17, wherein the first housing component is the window and the second housing component is the sidewall.

19. The method of claim 16, further comprising metallizing the sealing surface of the first housing component, the sealing surface of the second housing component, or the sealing surfaces of both the first and the second housing components with a metal that is wettable by the melted solder.

20. The method of claim 16, wherein the cover, the base, and the sidewall are constructed from ultra-high vacuum compatible materials, and the vacuum pressure is no greater than $10^{-5}$.

* * * * *